United States Patent
Yu et al.

(10) Patent No.: US 9,659,918 B2
(45) Date of Patent: May 23, 2017

(54) POP STRUCTURES WITH DAMS ENCIRCLING AIR GAPS AND METHODS FOR FORMING THE SAME

(71) Applicant: Taiwan Semiconductor Manufacturing Company, Ltd., Hsin-Chu (TW)

(72) Inventors: Chen-Hua Yu, Hsin-Chu (TW); Dean Wang, Tainan (TW); Chen-Shien Chen, Zhubei (TW); Chung-Shi Liu, Hsin-Chu (TW); Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/042,225

(22) Filed: Feb. 12, 2016

(65) Prior Publication Data
US 2016/0163683 A1    Jun. 9, 2016

Related U.S. Application Data

(62) Division of application No. 13/675,628, filed on Nov. 13, 2012, now Pat. No. 9,263,377.

(51) Int. Cl.
*H01L 23/28* (2006.01)
*H01L 25/00* (2006.01)
(Continued)

(52) U.S. Cl.
CPC .......... *H01L 25/50* (2013.01); *H01L 21/563* (2013.01); *H01L 21/764* (2013.01); *H01L 23/295* (2013.01); *H01L 23/315* (2013.01);
*H01L 23/49816* (2013.01); *H01L 23/49822* (2013.01); *H01L 23/49827* (2013.01); *H01L 25/105* (2013.01); *H01L 23/3128* (2013.01); *H01L 23/36* (2013.01); *H01L 24/16* (2013.01); *H01L 24/32* (2013.01); *H01L 24/48* (2013.01); *H01L 24/73* (2013.01); *H01L 24/80* (2013.01); *H01L 24/92* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/80895* (2013.01);
(Continued)

(58) Field of Classification Search
None
See application file for complete search history.

(56) References Cited

U.S. PATENT DOCUMENTS 5,969,461 A * 10/1999 Anderson ............... H01L 24/32
                                                                  174/260
6,048,656 A    4/2000 Akram et al.
(Continued)

*Primary Examiner* — Benjamin Sandvik
*Assistant Examiner* — Herve Assouman
(74) *Attorney, Agent, or Firm* — Slater Matsil, LLP

(57) ABSTRACT

A device includes a bottom package component that includes a bottom die, and a dam over a top surface of the bottom die. The dam has a plurality of sides forming a partial ring, with an air gap surrounded by the plurality of side portions. The air gap overlaps the bottom die. A top package component is bonded to the bottom package component, wherein the air gap separates a bottom surface of the top package component from the bottom die.

20 Claims, 9 Drawing Sheets

(51) Int. Cl.
*H01L 23/29* (2006.01)
*H01L 21/56* (2006.01)
*H01L 25/10* (2006.01)
*H01L 23/31* (2006.01)
*H01L 23/498* (2006.01)
*H01L 21/764* (2006.01)
*H01L 23/00* (2006.01)
*H01L 23/36* (2006.01)

(52) U.S. Cl.
CPC ............ *H01L 2224/92125* (2013.01); *H01L 2225/1023* (2013.01); *H01L 2225/1058* (2013.01); *H01L 2225/1088* (2013.01); *H01L 2225/1094* (2013.01); *H01L 2924/00014* (2013.01); *H01L 2924/15311* (2013.01); *H01L 2924/15331* (2013.01); *H01L 2924/18161* (2013.01)

(56) References Cited

U.S. PATENT DOCUMENTS

| | | |
|---|---|---|
| 6,268,654 B1 | 7/2001 | Glenn et al. |
| 7,187,067 B2 | 3/2007 | Weng et al. |
| 8,063,492 B2 | 11/2011 | Su et al. |
| 8,697,489 B2 | 4/2014 | Lee |
| 8,901,726 B2 | 12/2014 | Lin et al. |
| 2004/0100772 A1 | 5/2004 | Chye et al. |
| 2004/0201088 A1 | 10/2004 | Kim et al. |
| 2006/0087020 A1 | 4/2006 | Hirano et al. |
| 2007/0042530 A1* | 2/2007 | Kim ................. H01L 27/14618 438/108 |
| 2007/0200944 A1* | 8/2007 | Takeuchi .......... H01L 27/14618 348/294 |
| 2009/0102060 A1* | 4/2009 | Goida .................... H01L 24/83 257/777 |
| 2009/0273094 A1 | 11/2009 | Ha et al. |
| 2012/0074586 A1* | 3/2012 | Seo ........................ H01L 25/16 257/774 |
| 2012/0211885 A1 | 8/2012 | Choi et al. |
| 2012/0243569 A1 | 9/2012 | Tanaka et al. |
| 2012/0280404 A1 | 11/2012 | Kwon et al. |
| 2012/0295405 A1 | 11/2012 | Babiarz et al. |
| 2013/0172869 A1 | 7/2013 | Bonfeld |
| 2013/0175705 A1 | 7/2013 | Lin et al. |
| 2013/0270685 A1 | 10/2013 | Yim et al. |
| 2014/0084487 A1 | 3/2014 | Zhao et al. |
| 2014/0124955 A1 | 5/2014 | Chen et al. |
| 2014/0183724 A1 | 7/2014 | Yang |
| 2014/0327155 A1 | 11/2014 | Kang et al. |
| 2014/0374902 A1 | 12/2014 | Lee et al. |

\* cited by examiner

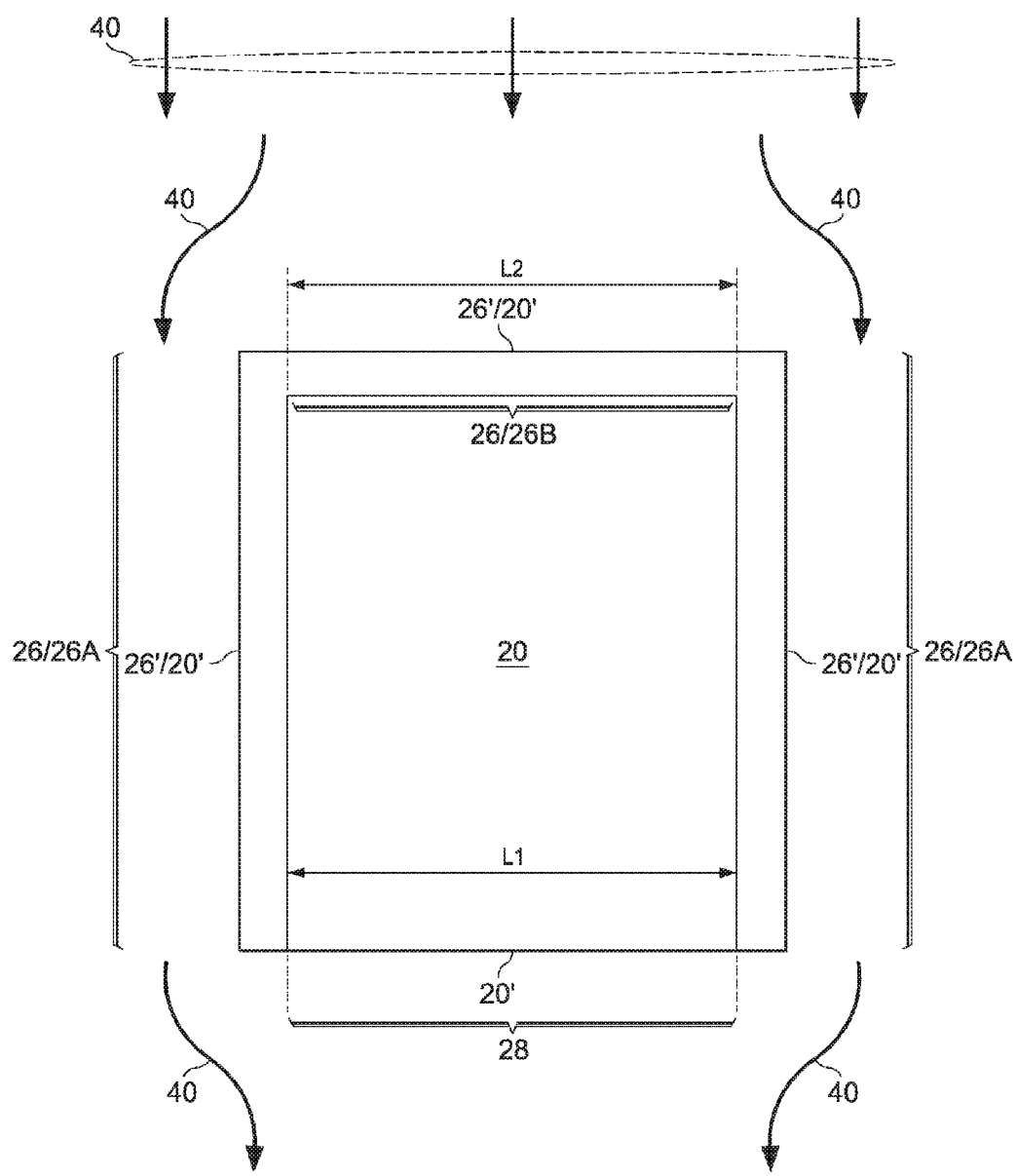

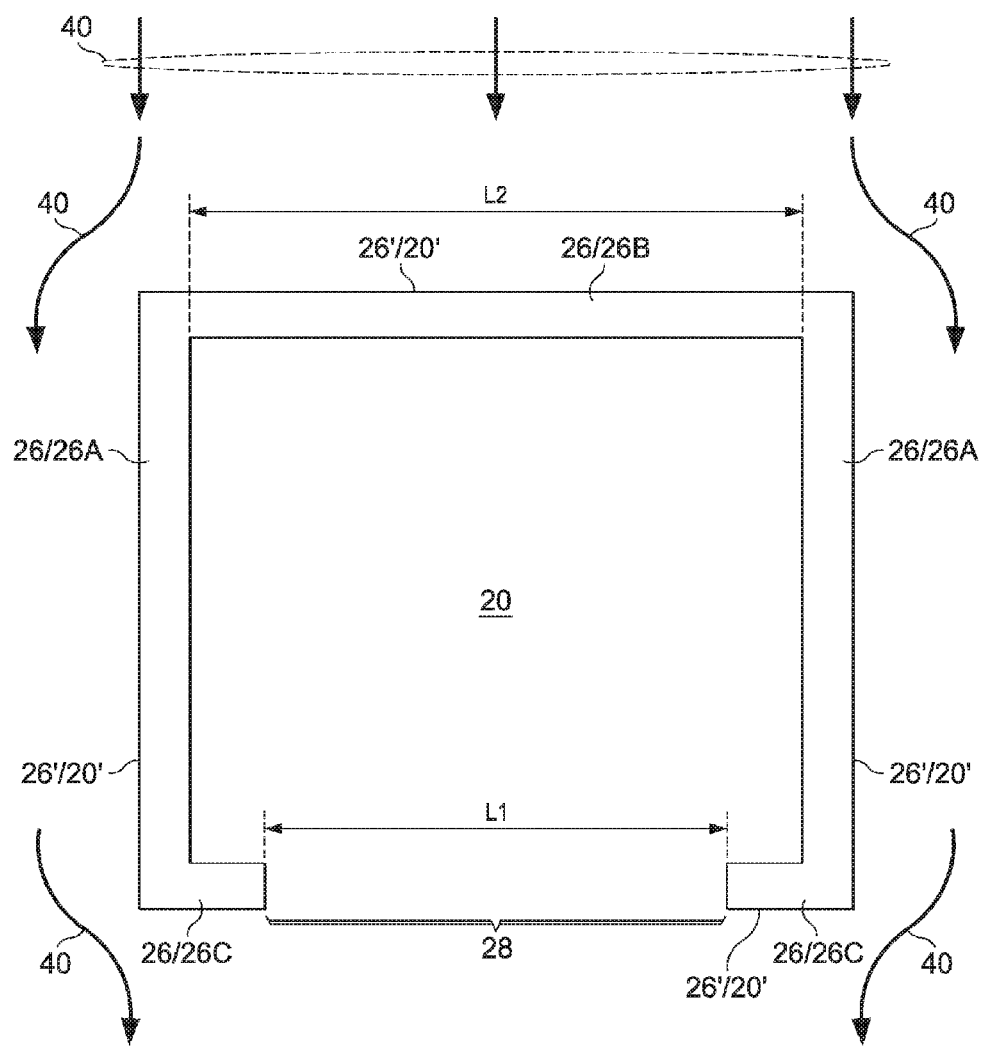

POP STRUCTURES WITH DAMS ENCIRCLING AIR GAPS AND METHODS FOR FORMING THE SAME

PRIORITY CLAIM AND CROSS-REFERENCE

This application is a divisional of U.S. patent application Ser. No. 13/675,628, entitled "POP Structures with Dams Encircling Air Gaps and Methods for Forming the Same," filed on Nov. 13, 2012, which application is incorporated herein by reference.

CROSS-REFERENCE TO RELATED APPLICATION

This application relates to the following commonly-assigned U.S. patent application Ser. No. 13/671,665, filed Nov. 8, 2012, and entitled "Package-on-Package Structure and Method of Forming the Same," which application is hereby incorporated herein by reference.

BACKGROUND

In a conventional package-On-package (POP) process, a top package, in which a device die is included, is bonded to a bottom package. The bottom package may also have a device die packaged therein. By adopting the PoP process, the integration level of the packages is increased.

In some existing PoP processes, a bottom package and a top package are formed first, and are then bonded to each other through solder balls. A molding compound is then filled into the space between the top package and the bottom package, so that the top package and the bottom package form a rigid structure.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3 through 7 are top views and cross-sectional views of exemplary dams in accordance with various embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package and the method of forming the same are provided in accordance with various embodiments. The intermediate stages of forming the package are illustrated in accordance with some embodiments. The variations of the embodiments are discussed. Throughout the various views and illustrative embodiments, like reference numbers are used to designate like elements.

Figure 1:
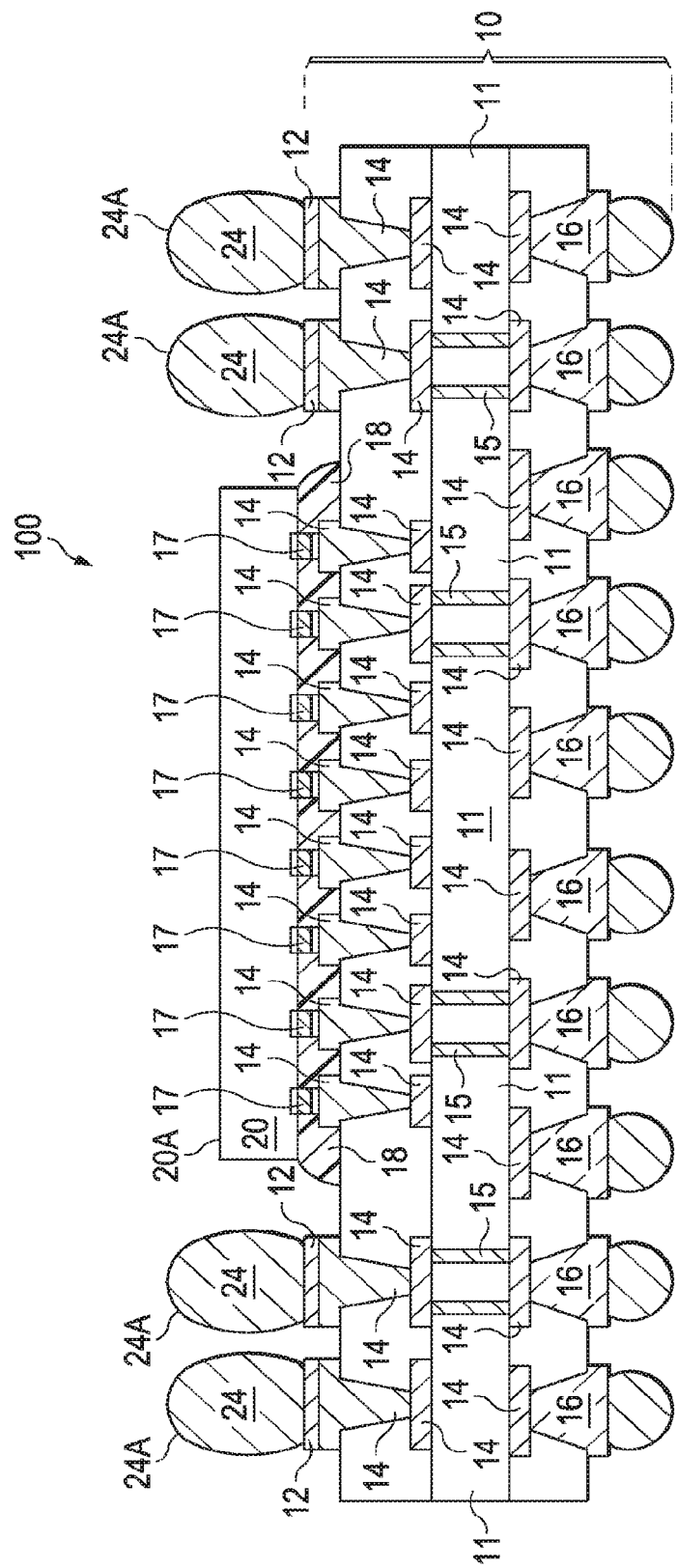
FIG. 1 illustrates the cross-sectional view of a bottom package in accordance with some exemplary embodiments.

Referring to FIG. 1, bottom package component 10 is provided. In some embodiments, bottom package component 10 is an interposer. In alternative embodiments, bottom package component 10 is a package substrate, which may be a build-up substrate or a laminate substrate. For example, as a build-up substrate, bottom package component 10 may comprise substrate 11 that is formed of a dielectric material, wherein conductive vias 15 penetrate through substrate 11. Bottom package component 10 may include metal lines/vias 14 on the opposite sides of substrate 11. Bottom package component 10 may also be a laminate substrate, which includes laminated dielectric films, and conductive traces built in the dielectric films. Bottom package component 10 is configured to electrically couple connectors 12 on the top side of bottom package component 10 to conductive features 16 on the bottom side of bottom package component 10. Conductive features 12 and 16 may be metal pads, for example.

Figure 9:
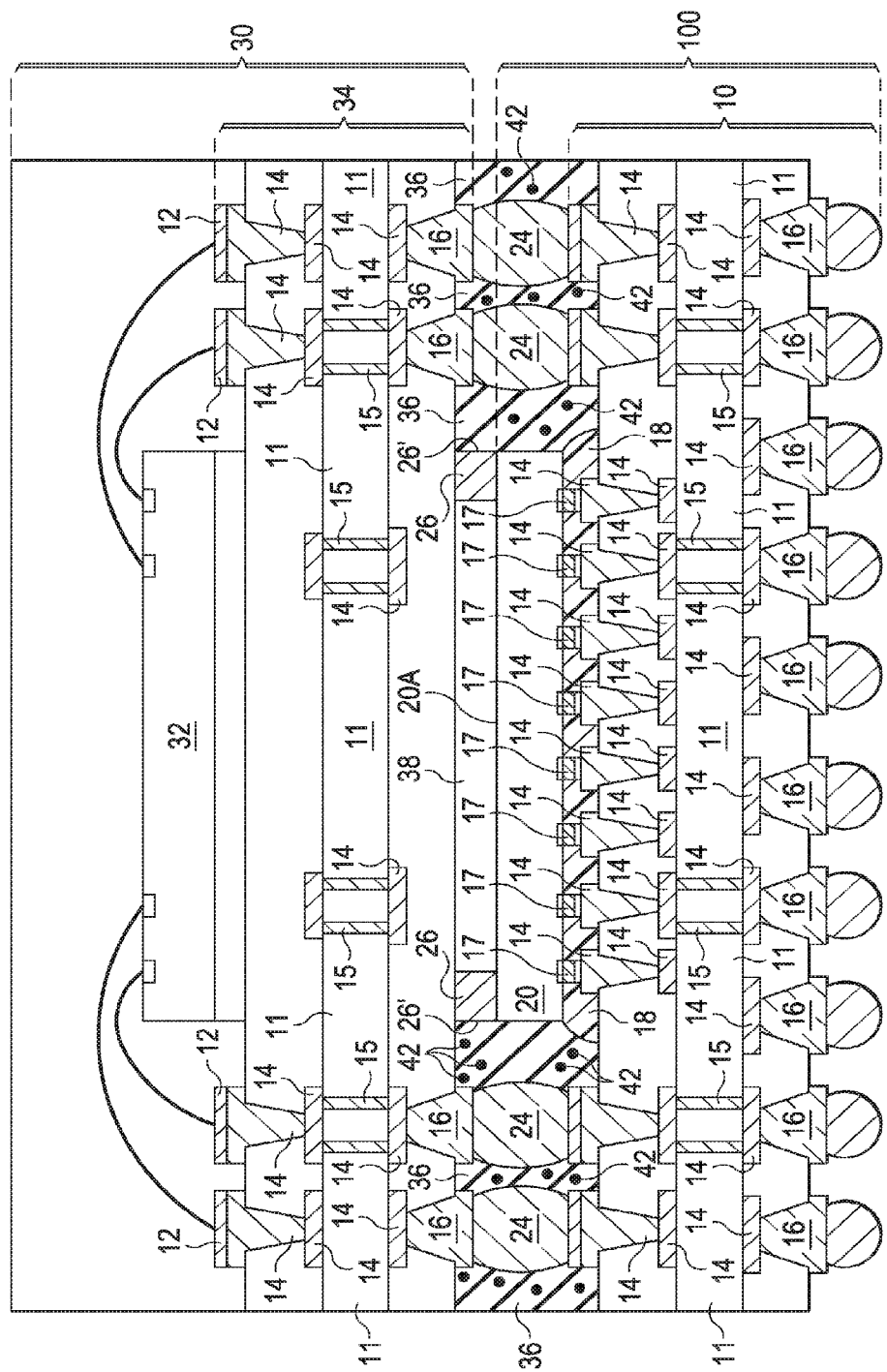
FIG. 9 illustrates the dispensing of a molding material between the top package and the bottom package, wherein an air gap is formed between the top package and the device die, which is in the bottom package.

Package component 20 is bonded to bottom package component 10 through connectors 17. Package component 20 may be a die, and hence is alternatively referred to as die (or bottom die) 20 hereinafter, although it may also be another type of package component such as a package. Die 20 may be a device die comprising integrated circuit devices (not shown) such as transistors, capacitors, inductors, resistors, and/or the like. In some embodiments, die 20 is a logic die that comprises logic devices. The bonding of die 20 to package component 10 may be a solder bonding or a direct metal-to-metal bonding (such as copper-to-copper bonding). In some embodiments, underfill 18 is dispensed into the gap between die 20 and package component 10. In alternative embodiments, no underfill is dispensed between die 20 and package component 10 at this step, and the space between die 20 and bottom package component 10 is filled with a molding underfill in a subsequent step (FIG. 9). Throughout the description, the structure shown in FIG. 1 is referred to as bottom package 100.

In some embodiments, connectors 24 are formed on the top surface of package component 10. Connectors 24 may be electrically coupled to connectors 12 and conductive features 16. In the exemplary embodiments, connectors 24 are solder balls. Alternatively, connectors 24 may comprise metal pads, metal pillars, solder caps formed on metal pillars, and/or the like. Connectors 24 are not covered by die 20. In some embodiments, top ends 24A of connectors 24 are higher than the top surface 20A of die 20. In alternative embodiments, connectors 24 are pre-formed on the surface of top package component 30 (FIG. 8) rather than formed on the top surface of bottom package component 10.

Figure 2:
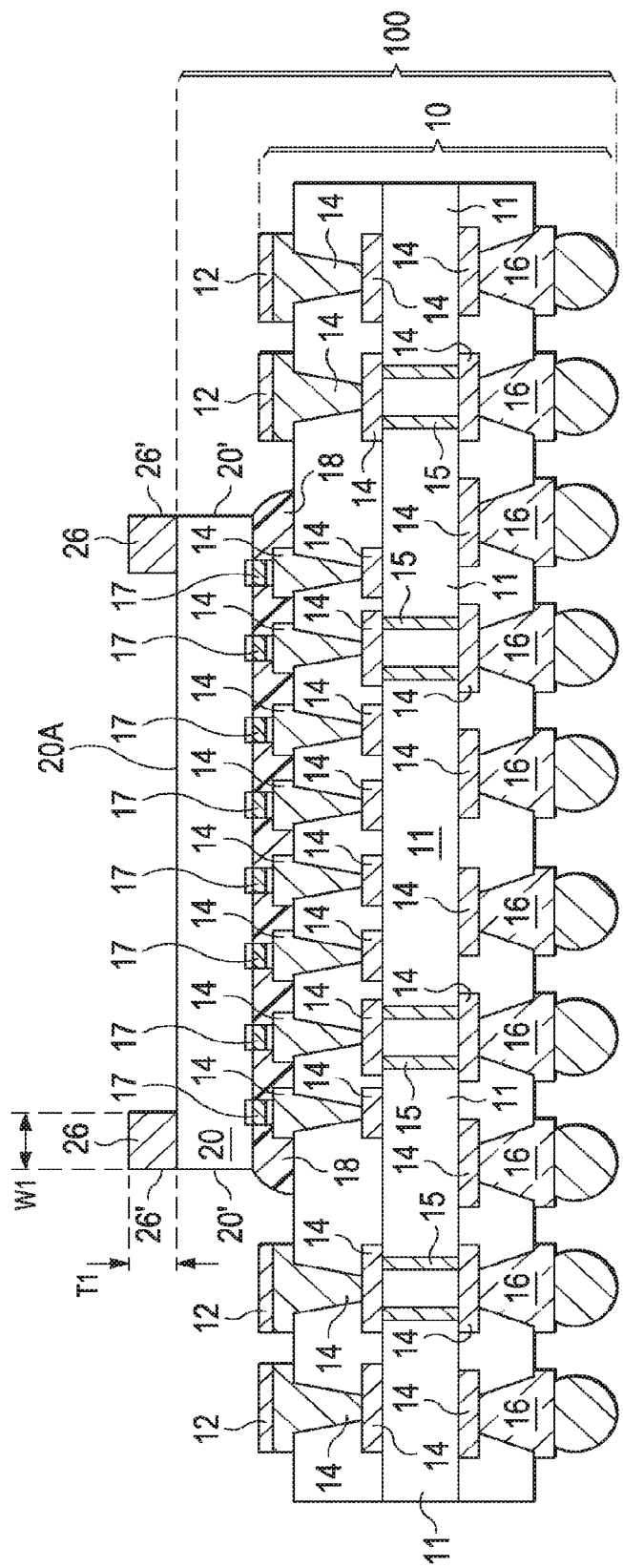
FIG. 2 illustrates the formation of a dam over a device die in the bottom package.

Referring to FIG. 2, dam 26 is formed on top surface 20A of die 20. In some embodiments, dam 26 is pre-formed, and then adhered onto top surface 20A through an adhesive (not shown). In alternative embodiments, dam 26 is an adhesive by itself. Dam 26 may be formed of a low thermal conductivity material such as Plastic Insulation, Fiberglass, low-density polymer, or the like. In alternative embodiments, dam 26 is formed of a material that has a low thermal conductivity, which thermal conductivity may be lower than about $0.1 \, W \cdot m^{-1} \cdot K^{-1}$. Dam 26 covers some edge portions of top surface 20A, and leaves a center portion of top surface 20A uncovered. Thickness T1 of dam 26 may be between about 40 μm and about 100 μm. Width W1 of dam 26 may be between about 1,000 μm and about 2,000 μm. It is appreciated, however, that the values recited throughout the description are merely examples, and may be changed to different values.

FIGS. 3 through 5A are exemplary top views of dam 26 and die 20. In some embodiments as shown in FIG. 3, dam 26 includes three side portions, with two side portions 26A being parallel to each other, and connected to the opposite ends of a third side portion 26B of dam 26. Each of side portions 26A and 26B is adjacent to, and may be parallel to, one of edges 20' of die 20. Edges 26' (also refer to FIG. 2) of dam 26 may be aligned to the respective edges 20' of die 20 in accordance with some exemplary embodiments. In alternative embodiments, edges 26' are slight spaced apart from the respective edges 20', and are directly over die 20. Dam 26 forms a partial ring that has three side portions. Dam 26 in FIG. 3 is accordingly referred to as a partial ring, with opening 28 in the partial ring, wherein opening 28 has opening size L1 close to distance L2 between side portions 26A. Opening size L1 is the lateral size of opening 28 measured in the direction parallel to the respective closest edge 20' of die 20.

In FIG. 4, dam 26 includes four sides including two side portions 26A and one side portion 26B. Side portions 26A and 26B form a continuous dam strip that proximates three edges of die 20. Dam 26 further includes side portion 26C, with opening 28 formed in side portion 26C. Opening 28 may have opening size L1 between about 10 percent and about 90 percent length L2 between side portions 26A. In the embodiments in FIG. 4, dam 26 also forms a partial ring, with opening 28 interconnecting the space inside the partial ring and the space outside the partial ring.

Figure 5A:
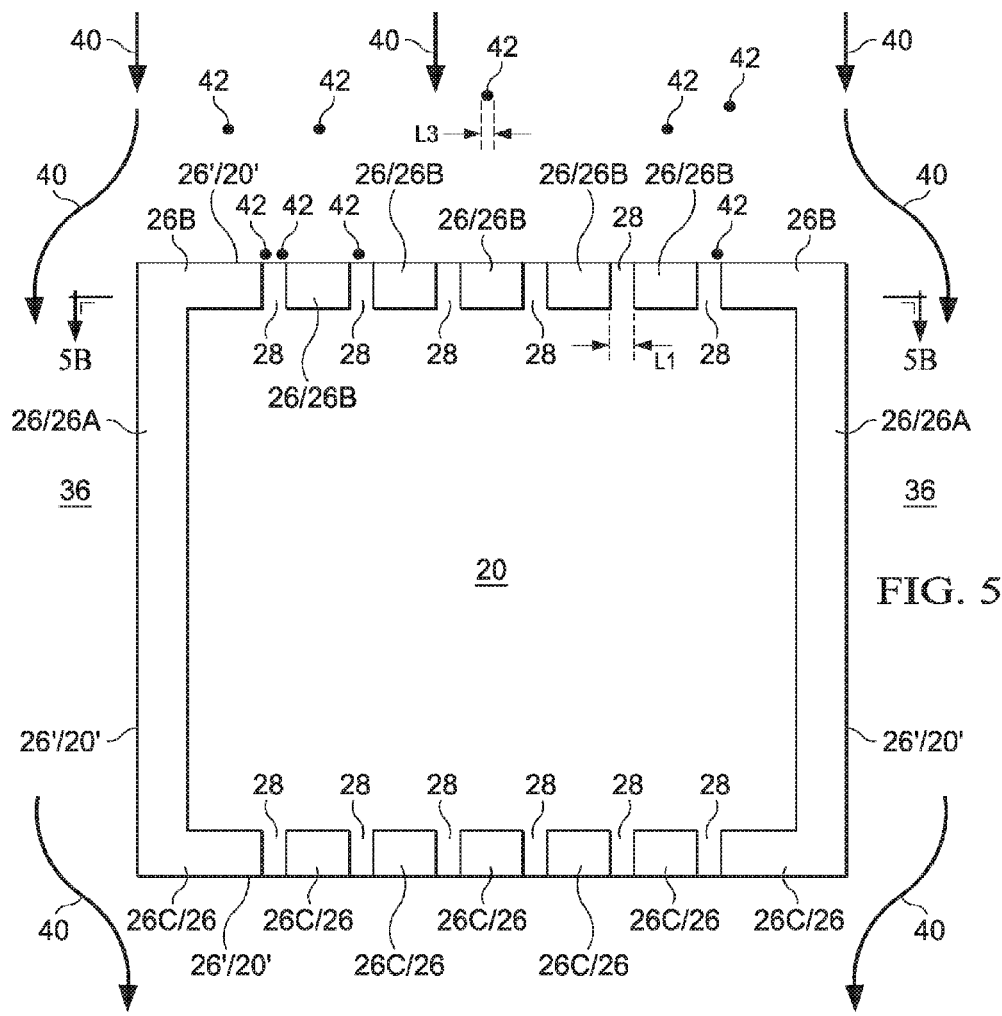
Figure 5B:
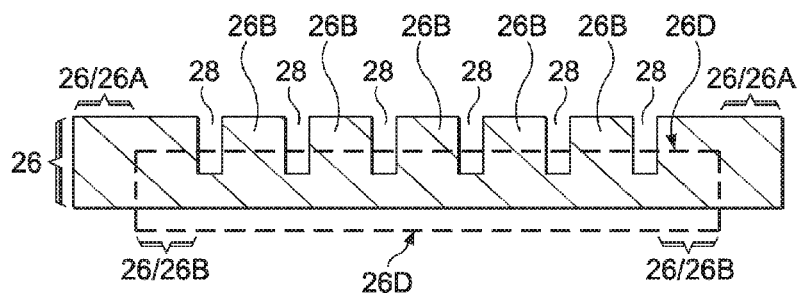

FIG. 5A illustrates the top view of dam 26 and die 20 in accordance with alternative embodiments. In these embodiments, side portion 26B comprises a plurality of openings 28. Opening size L1 of openings 28 may be smaller than about 5 um. FIG. 5B illustrates a cross-sectional view of dam 26, wherein the cross-sectional view is obtained from the plane crossing line 5B-5B in FIG. 5A. As shown in FIG. 5B, side portion 26B of dam 26 may comprise a bottom layer 26D that continuously extends from one side portions 26A to the opposite side portion 26A of dam 26. With bottom layer 26D acting as the joints, the entirety of dam 26 may be joined together as an integrated portion that has no loose pieces. Dam 26 hence can be adhered on die 20 easily.

In some embodiments, side portion 26C of dam 26 also includes a plurality of openings 28, wherein side portion 26C may have a structure similar to, or essentially the same, as side portion 26B. In alternative embodiments, no opening is formed in side portion 26C. Furthermore, one or both of side portions 26A may also include openings that are similar to openings 28. Alternatively, one or both of side portions 26A may have no openings therein.

Figure 6:
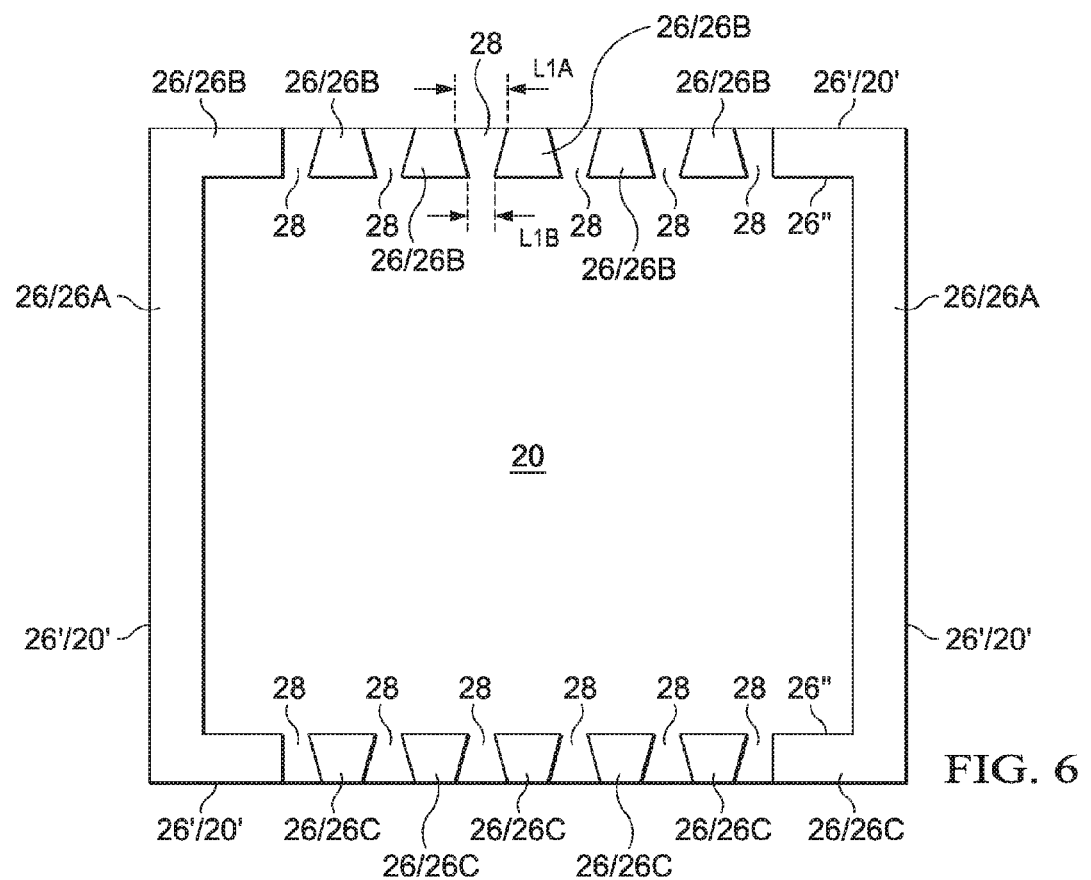
Figure 7:
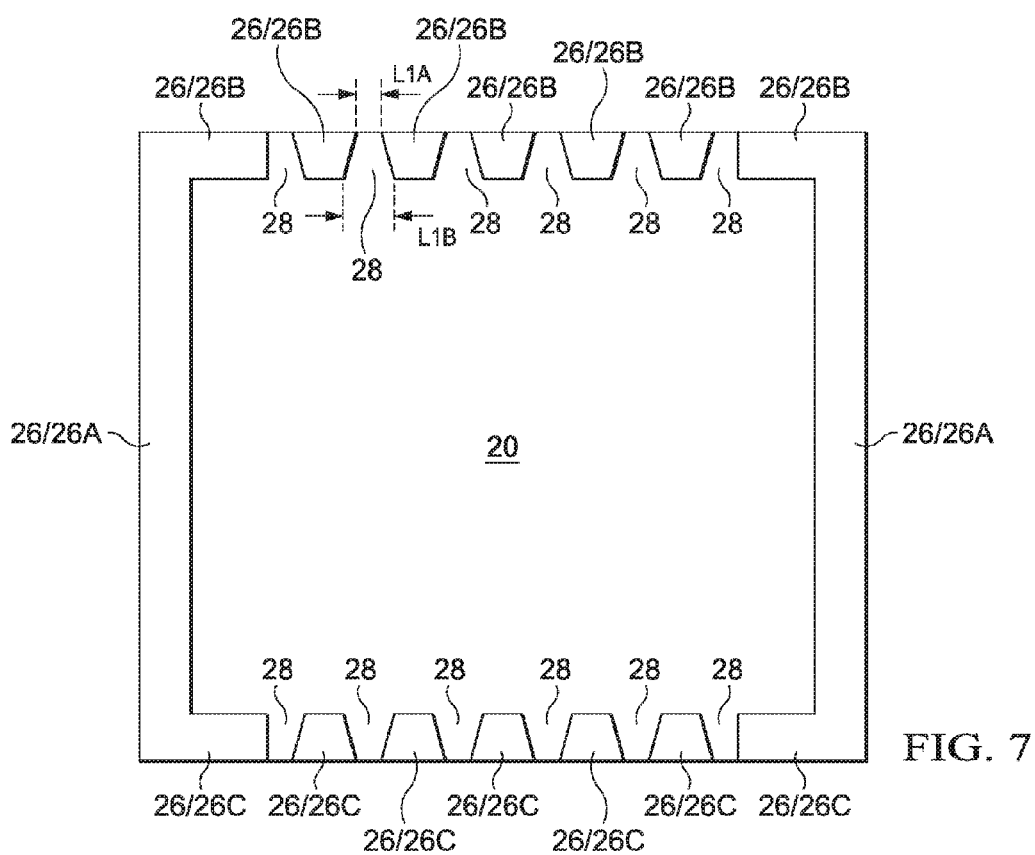

FIGS. 6 and 7 illustrate the top view of dam 26 in accordance with yet alternative embodiments. In these embodiments, openings 28 have outer opening size L1A different from inner opening size L1B, wherein outer opening size L1A is measured along outer edge 26' of dam 26, and inner opening size L1B is measure along inner edge 26'' of dam 26. Inner edges 26'' face the inner space defined by dam 26. In FIG. 6, outer opening size L1A is greater than inner opening size L1B. In FIG. 7, outer opening size L1A is greater than inner opening size L1B. Similar to the embodiments in FIGS. 5A and 5B, in some exemplary embodiments, openings 28 are formed in both side portions 26B and 26C of dam 26. In alternative embodiments, openings 28 are formed in side portion 26B, but not in side portion 26C. Side portions 26A may, or may not, include openings 28. The cross-sectional views of dam 26 in accordance with FIGS. 6 and 7 may be similar to what is shown in FIG. 5B.

Figure 8:
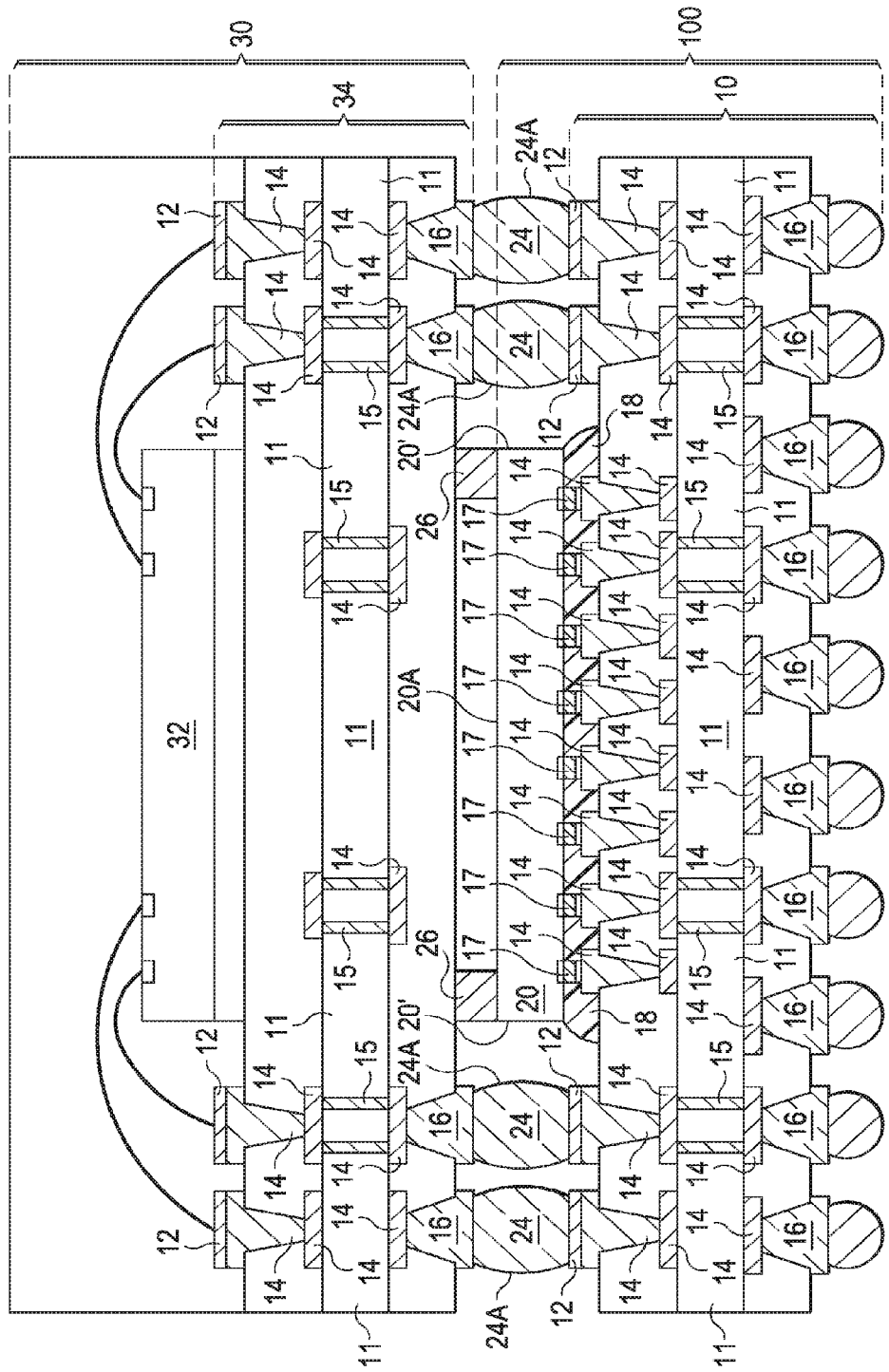
FIG. 8 illustrates the bonding of a top package to the bottom package, with the dam located between the top package and the bottom package.

Referring to FIG. 8, top package component 30 is bonded to bottom package component 10 (and hence bonded to bottom package 100) through connectors 24. In some embodiments, connectors 24 comprise solder, which is reflowed to join top package component 30 to package component 10. Top package component 30 may be a package that includes device die 32, and package substrate 34 bonded to device die 32. Furthermore, molding material 35 may be pre-molded on device die 32 before the bonding of top package component 30 to bottom package 100. Die 32 may be a memory die in some exemplary embodiments. In alternative embodiments, top package component 30 is a device die. The bottom surface of top package component 30 may be in contact with the top surface of dam 26. During the reflow of connectors 24, dam 26 may support top package component 30, so that connectors 24 are not crashed.

Next, as shown in FIG. 9, molding material 36 is filled into the space between package components 10 and 30, and is then cured. Molding material 36 may be a molding compound, a molding underfill, or the like. In the embodiments wherein dam 26 has the profile as in FIGS. 3 and 4, molding material 36 may be dispensed into the space in the direction shown as arrows 40, as shown in FIGS. 3 and 4. With opening 28 formed on the side of dam 26 that opposite to the incoming direction of molding material 36, during the dispense of molding material 36, the inner space defined by dam 26 is not filled with molding material 36, and air remains in the inner space. The inner space, however, may still exchange air with the external environment during the dispensing of molding material 36, so that the air pressure in the inner space is balanced with the pressure in external environment. The inner space defined by dam 26 thus forms air gap 38, as shown in FIG. 9. After the dispensing of molding material 36, air gap 38 may be encircled by molding material 36 when viewed from the top of the package in FIG. 9. Furthermore, molding material 36 contacts outer edges 26' of dam 26.

Molding material 36 may include a filler therein, wherein the filler exists in the form of filler particles 42, as shown in FIGS. 5A and 9. Although a few scatted filler particles 42 are shown, molding material 36 may comprise up to 90 volume percent or more filler particles 42, for example. In the embodiments shown in FIG. 5A, opening size L1 is smaller than the particle size L3 of filler particles 42. In some exemplary embodiments, filler particles 42 comprise silicon carbide, silicon, and/or the like.

In the embodiments in FIG. 5A, molding material 36 is dispensed in the direction marked by the arrow 40. Accordingly, filler particles 42 along with the polymer in molding material 36 are blocked at the entrance of openings 28. Air, however, may still pass through openings 28, so that the pressure in air gap 38 is balanced with the outside pressure.

In the embodiments, as shown in FIG. 9, air gap 38 separates die 20 from package component 30. Air gap 38 has a low thermal conductivity, and hence acts as a thermal insulation between die 20 and package component 30. In some embodiments, die 20 is a logic die, and die 32 is a memory die. With air gap 38 located between dies 20 and 32, the heat generated in die 20 has a low dissipation rate to dissipate to memory die 32, and hence memory die 32 is affected less by the heat generated in die 20. Dam 26, besides defining air gap 38, may also define the distance between package components 10 and 30, and hence connectors 24 may have an optimized height after the bonding of package components 10 and 30.

In accordance with embodiments, a device includes a bottom package component that includes a bottom die, and a dam over a top surface of the bottom die. The dam has a plurality of sides forming a partial ring, with an air gap surrounded by the plurality of side portions. The air gap overlaps the bottom die. A top package component is bonded to the bottom package component, wherein the air gap separates a bottom surface of the top package component from the bottom die.

In accordance with other embodiments, a device includes a bottom package. The bottom package includes a bottom package substrate, and a bottom device die over and bonded to the bottom package substrate. A top package is over and bonded to the bottom package substrate, wherein the top package is spaced apart from the bottom device die by an air gap. A molding material is disposed between the bottom package and the top package.

In accordance with yet other embodiments, a method includes forming a dam over a bottom die of a bottom package, wherein the dam includes a plurality of side portions defining a space therebetween. A top package is bonded to the bottom package, wherein the dam is underlying the top package. A molding material is dispensed into a space between the top package and the bottom package. After the step of dispensing, an air gap is formed from the space surrounded by the dam.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a dam over a bottom die of a bottom package, wherein the dam comprises a plurality of side portions surrounding a space therebetween, and the dam comprises:
        a first side portion and a second side portion parallel to each other, wherein the first and the second side portions of the dam are adjacent to a first edge and a second edge of the bottom die, respectively; and
        a third side portion comprising a plurality of openings therein;
    bonding a top package to the bottom package, wherein the dam is underlying the top package; and
    dispensing an encapsulating material into a space between the top package and the bottom package, wherein after the dispensing, an air gap is formed from the space surrounded by the dam, and the plurality of openings has opening sizes smaller than sizes of particles of a filler in the encapsulating material, and wherein in the dispensing the encapsulating material, the encapsulating material is dispensed from the third side portion of the dam and flows along the first side portion and the second side portion of the dam.

2. The method of claim 1, wherein during the bonding, the dam supports the top package, with a top surface of the dam contacting a bottom surface of the top package.

3. The method of claim 1, wherein during the dispensing the encapsulating material, the particles in the encapsulating material and a polymer in the encapsulating material are blocked outside of the air gap.

4. The method of claim 1, wherein the forming the dam comprises:
    pre-forming the dam; and
    attaching the dam to a top surface of the bottom die.

5. The method of claim 1, wherein during the dispensing the encapsulating material, air is allowed to pass through an opening in the dam, and the encapsulating material is blocked outside of the air gap.

6. A method comprising:
    bonding a device die to a top surface of a package substrate;
    attaching a dam to a top surface of a device die, wherein the dam forms a partial ring surrounding an inner space;
    bonding a top package to the package substrate, with a top surface of the dam in contact with a bottom surface of the top package, wherein the top package and the package substrate have a gap therebetween, and the gap is connected to the inner space through a first opening in a first side of the dam; and
    dispensing an encapsulating material into the gap, wherein the encapsulating material comprises filler particles, and a width of the first opening is smaller than sizes of the filler particles, and wherein the encapsulating material is kept outside of the inner space.

7. The method of claim 6, wherein the encapsulating material encircles the dam and the inner space.

8. The method of claim 6, wherein the dam comprises a second side with no opening therein, and the second side is opposite to the opening, and the encapsulating material is dispensed from the second side, and the encapsulating material flows from the second side to the first side.

9. The method of claim 6, wherein the dam further comprises a second opening in a second side of the dam, with the first side and the second side being opposite sides, and wherein the encapsulating material is dispensed in a direction parallel to a direction pointing from the first opening to the second opening.

10. The method of claim 6, wherein the first opening is in an upper portion of the first side of the dam, and the first side of the dam comprises a portion directly underlying the first opening.

11. The method of claim 6, wherein the first opening has an inner width measured on an inner sidewall of the first side of the dam, and an outer width measured on an outer sidewall of the first side of the dam, and the inner width and the outer width are different from each other.

12. A method comprising:
    bonding a device die to a top surface of a package substrate;
    attaching a dam to a top surface of a device die, wherein the dam comprises a first side portion and a second side portion opposite to each other, and a third side portion and a fourth side portion opposite to each other, wherein the first side portion comprises a first break, and the second side portion comprises a second break;

bonding a top package to the package substrate, with a top surface of the dam in contact with a bottom surface of the top package; and dispensing an encapsulating material to encircle the dam, wherein the encapsulating material is kept outside of an inner space defined by the dam.

13. The method of claim 12, wherein the encapsulating material is dispensed from the first side portion, and air in the inner space is evacuated from the second break.

14. The method of claim 12, wherein during the dispensing, fillers in the encapsulating material are blocked from entering the inner space.

15. The method of claim 12, wherein during the dispensing, a polymer in the encapsulating material is blocked from entering the inner space.

16. The method of claim 12, wherein the first break is in an upper portion of the first side portion of the dam, and the first side portion of the dam comprises a portion directly underlying the first break.

17. The method of claim 12, wherein the dam is pre-formed before being attached to the device die.

18. The method of claim 12, wherein the first break and the second break extend from a top surface of the dam into the dam.

19. The method of claim 18, wherein the first break has a bottom located at a level between the top surface of the dam and a bottom surface of the dam.

20. The method of claim 6, wherein the first opening has a bottom located at a level between a top surface of the dam and a bottom surface of the dam.

* * * * *